United States Patent [19]

Mehdipour

[11] Patent Number: 5,185,716
[45] Date of Patent: Feb. 9, 1993

[54] THREE DIMENSIONAL COMBINED MAGNETO-OPTICAL MEMORY AND LOGIC PROCESSOR

[76] Inventor: Frank F. Mehdipour, 250 N. Robertston Blvd. Suite 520, Beverly Hills, Calif. 90210

[21] Appl. No.: 733,693

[22] Filed: Jul. 22, 1991

[51] Int. Cl.$^5$ .............................................. G11C 19/08
[52] U.S. Cl. ...................................... 365/10; 365/122
[58] Field of Search .................... 365/10, 122, 130; 360/59, 131, 135; 369/13

[56] References Cited

U.S. PATENT DOCUMENTS 4,660,173 4/1987 Mehdipour ........................... 365/10

Primary Examiner—Joseph A. Popek

[57] ABSTRACT

A three-dimensional combined magneto-optic memory and logic processor consisting of layers of magnetic bubble material spaced from and parallel to one another. Each layer has a pattern of magnetic bubbles formed under the control of an external data processing system. A laser beam is directed through the layers, and binary signals corresponding to the overall patterns of the magnetic bubbles on all the layers which intersect the beam are detected by a first detector array. Data and logic functions are programmed on to each layer by appropriate control of the magnetic bubbles by the external processing system. Wave guides are provided to reflect light from the magnetic bubbles to a second detector array. In this manner, the two detector arrays may be caused to generate electric signals representing data and logic functions, thereby eliminating the bottleneck between processor and memory which is prevalent in prior art data processing systems.

5 Claims, 2 Drawing Sheets

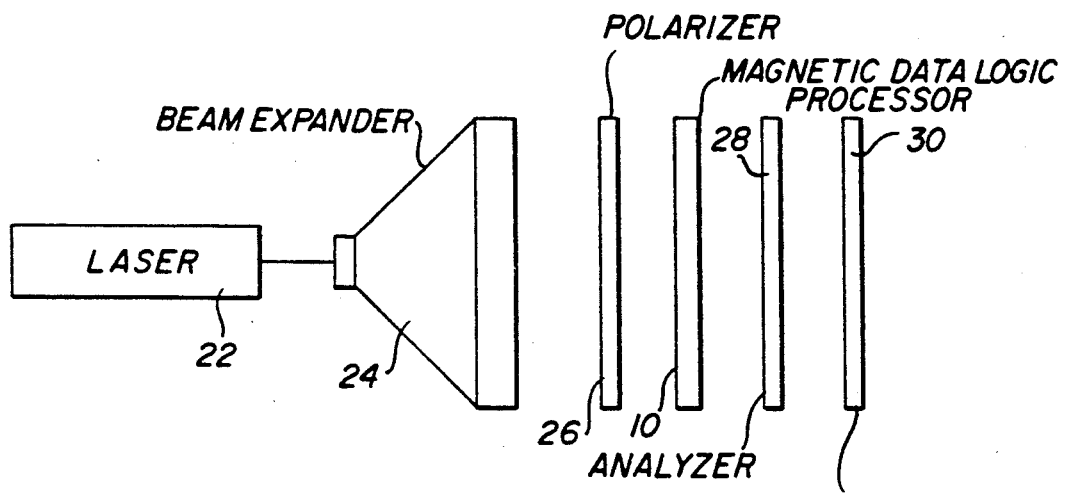
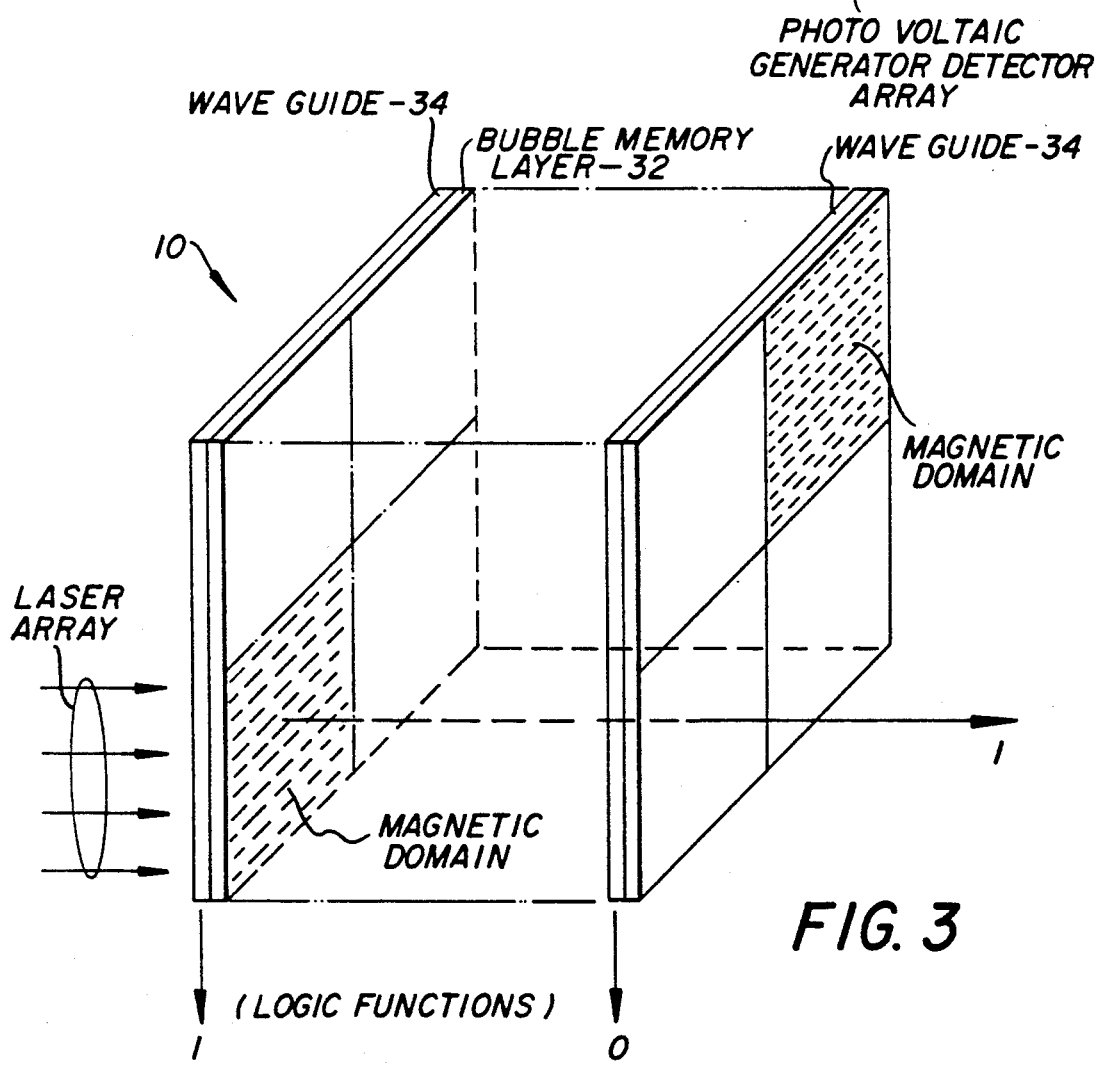

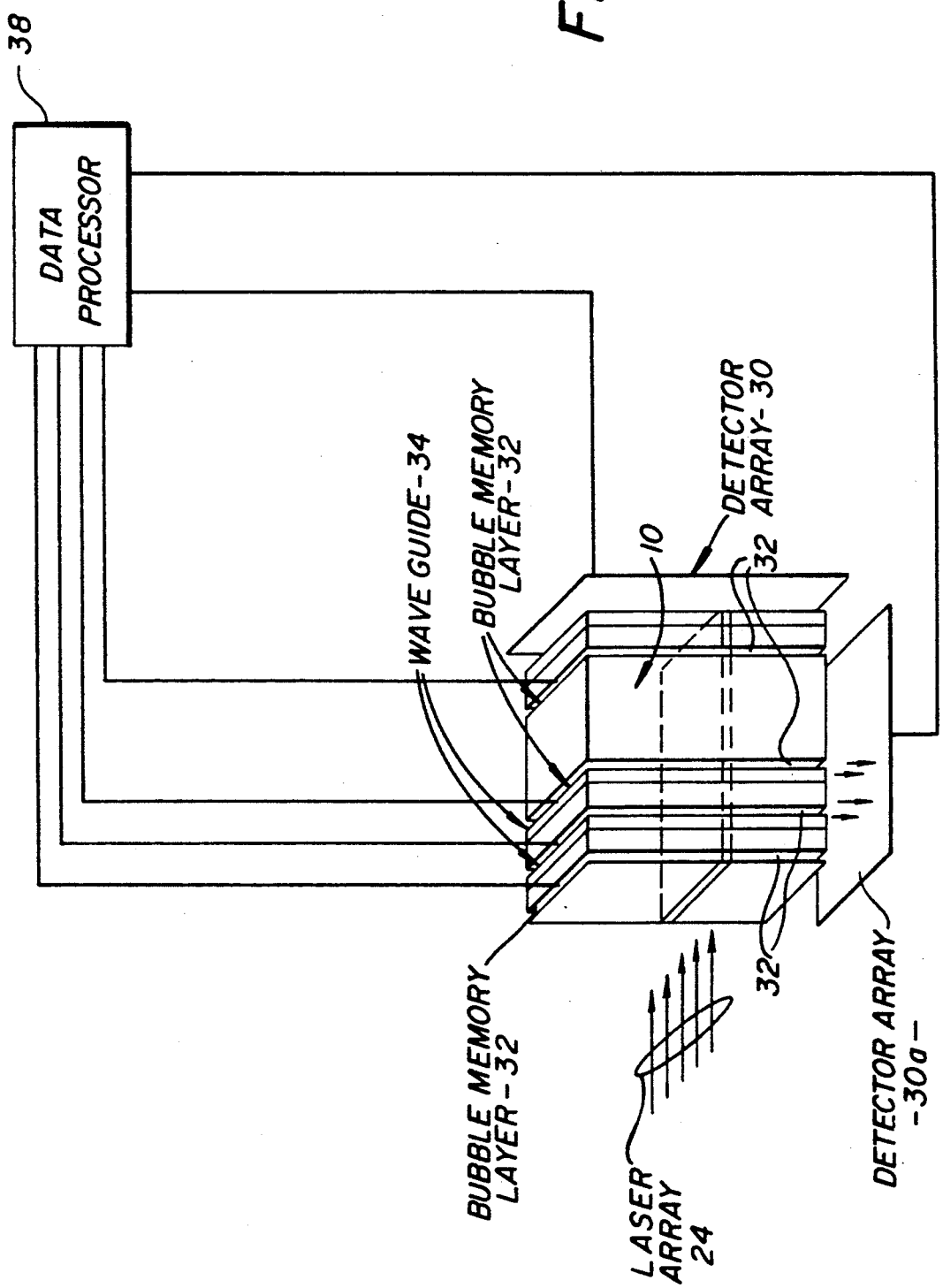

THREE DIMENSIONAL COMBINED MAGNETO-OPTICAL MEMORY AND LOGIC PROCESSOR

BACKGROUND OF THE INVENTION

The invention is concerned with a three-dimensional combined magneto-optical memory and logic processor which comprises a plurality of parallel sheets (layers) of magnetic bubble material, such as an ortho-ferrite garnet, or an amorphous substance. For example, each layer comprise a single crystal bismuth substituted iron garnet film grown on a non-magnetic substrate. These layers are transparent to light, electromagnetic beams or lasers. Each layer has an array of two-dimensional electrical addressable pixels, or magnetic bubbles, which affects the polarization state of light transmitted through the particular layer. A multiplicity of such layers are placed parallel to one another to form the three-dimensional combined memory and logic processor of the invention.

As described in U.S. Pat. No. 4,660,173, which issued Apr. 21, 1987, in the name of the present inventor the three-dimensional magneto-optic memory operates by passing vertically polarized light through each layer and through each pixel (magnetic bubble) in the array formed on each layer. This causes a polaroid light to exhibit a large magneto-rotation effect by which the plane of polarization for linearly polarized light transmitted by each bubble is rotated, either clockwise or counter-clockwise depending on the magnetization of the bubble. The rotation angle is d: where: d is the thickness of the material, and is the Faraday rotation co-efficient.

In order to analyze the polarization state of the light transmitted through the layers, the light from the memory is passed through an analyzer polarizer. This polarizer may be oriented to block the light which passes through the one of magnetic bubbles, but to pass the light which does not pass through a magnetic bubble. The magnetic bubbles may be established on each layer in desired patterns which are programmable by an external data processing system. The patterns may be major loop or minor loop bubble systems, T-bar angel fish, cross-conduction channels, or any other suitable type of known configuration. Biased magnetic fields may be used to establish the magnetic bubbles on each layer in the desired pattern under the control of the external data processing system.

In the system to be described, the magnetic bubbles on each layer represent either binary data stored in the device or logic functions. The presence or absence of a magnetic bubble, or an incomplete bubble, at any particular location on each layer indicates binary 1 or 0 or −1. The electro-magnetic (laser) beam passing through each layer and indicating different bubble combinations, such as 0-1-0 may indicate data or logic functions, as the three-dimensional processor of the invention performs a dual function of a memory and also as a logic processor. Logic functions similar to "and", "or", "nor", or mathematical operations may be programmed on each layer.

To reiterate, each layer of the three-dimensional system to be described has the property that when subjected to a particularly biasing magnetic field directed perpendicular to the surface, small bubble domains are formed with polarization oppositely directed to that of the rest of the material of the layer. Local magnetic fields applied to the layer can be used to generate or annihilate the magnetic bubbles, as explained above. For example, conductive loops may be placed on the surface to generate magnetic fields, which drive the bubbles in particular directions. A property of the ortho ferrite magnetic bubble domain materials is that the polarization of light passing through the bubbles is altered in a manner different from that of the light passing through the remainder of the material because of the occurrence of magneto-optic rotation and change in wavelength. The polarization effects are similar to the polarization effects encountered in a magnetic hologram as described in an article in the IEEE Transactions on Magnetics, Vol MAG-6, No. 3 September 1970, by Haim Haskal entitled "Polarization and Efficiency in Magnetic Holography".

As described in the article, a laser beam E linearly polarized in the Y plane, for example, is rotated by a magnetic hologram via the Faraday or Kerr effect. When such a beam E is passed through a magnetic bubble, the polarization of the beam as it passes through the bubble is rotated by an angle F; where F is the specific Faraday rotation in degrees/centimeter, and t is the thickness of the magnetic film forming the bubble.

SUMMARY OF THE INVENTION

A three-dimensional combined magneto-optic memory and logic processor is provided consisting of layers of magnetic bubble material. Each layer has a pattern of magnetic bubbles formed thereon on under the control of a external data processing system. A laser beam, or the like, is directed through the layers, and binary signals corresponding to the overall patterns of the magnetic bubbles on all the layers which intersect the beam are detected by a first detector array. Data and logic functions similar to "and", "nor", "or" or mathematical operations, are programmed onto each layer by appropriate control of the magnetic bubbles by the external processing system. The beam passing through the layers cause the first detector array to generate electric signals indicating different combinations of the aligned bubbles, such as 1-0-1 etc. These signals may represent data or logic functions. Wave guides are provided to reflect the beam as it impinges on the magnetic bubble of each layer and to direct the reflected beams to a second detector array which functions as a position sensor of the magnetic bubbles on each layer to represent data or logic functions. Data and logic functions may be processed instantly in the system of the invention eliminating the bottle-neck between processor and memory which is prevalent in prior art data processing systems.

BRIEF DESCRIPTION OF THE DRAWING

FIG. 1 is a schematic diagram which appears in U.S. Pat. No. 4,660,173, and which illustrates the underlying principals of the operation of magnetic-optic systems;

FIG. 2 is a schematic diagram showing the three-dimensional combined magnetic-optic memory and logic processor of the invention, and certain external controls for the processor; and FIG. 3 is a simplified diagram illustrating the operation of the segment of the processor of FIG. 2.

The optical processing system of FIG. 2 may be used for retrieving data from the three-dimensional processor of the invention, which will be described. A high frequency collimated laser beam generated by a laser 22 and expanded by a beam expander 24 is passed through a polarizer 26, and the resulting polarized beam is used to illuminate magnetic bubbles formed in a magneto-optic memory 10, as will be described. The polarized beam emerging from the memory 10 is passed through an analyzer 28 to a photovoltaic detector array 30. Detector array 30 is made up of a multiplicity of individual photo cells and, due to the action of polarizer 26 and analyzer 28, all of the cells corresponding to areas of the memory which do not contain magnetic bubbles are illuminated, and the cells aligned with the bubbles are not illuminated. In this manner, and by appropriate computer and data processing systems, data represented by the positions of the magnetic bubbles in the memory 10 can be retrieved.

The memory 10, as shown in FIG. 2, is made up of a multiplicity of bubble memory layers 32 positioned parallel to one another. Adjacent the respective layers are wave guides 34.

The beam from the laser array of 24 FIG. 2 passes through the various layers, and through the corresponding polarizer and analyzer (not shown) to be detected by the detector array 30 as described above. The wave guides 34 reflect a portion of the laser beam incident on each of the bubble memory layers in a perpendicular direction down to a second detector array 30a which may be similar to the detector array 30. The patterns of the magnetic bubbles on each layer 34 may be controlled by an external data processor 38.

As stated above, the three dimensional magnetic-optic unit 10 serves not only as a memory for data processor 38, but also as a logic processor. Data and logic functions may be placed in the unit 10 under the control of the data processor, as described above. The detector arrays 30 and 30a are connected back to the data processor 38 to reprogram the patterns of magnetic bubbles on the bubble memory layers, or for other purposes.

An article appearing in Photonics Spectra, Dec. 19, 1990, at page 129 by Miles Murdecca et al., entitled "Logic and Interconnects in Optical Computers", describes an optical computing support system which uses arrays of optical logic gates interconnected in free space with passive components, such as beam splitters, mirrors, lenses and holograms. Optical signals between logic gates travel orthognally to the device substrates as beams of light, and the positions of the beams are permitted optically between logic arrays to achieve gate-to-gate interconnection. The position of the logic gate on an array correspond to the cross points Cartisan grid, and all the devices on the same array perform the same function as "or" or "nor", and the gate level interconnects between arrays form regular patterns such as banyans or crossovers.

The three-dimensional optic processor of the present invention also stores logic functions similar to "and", "or", "nor" gates in the magneto-optic unit in conjunction with data. Accordingly, and as mentioned above, data and logic functions can be processed instantly in the system of the invention, thereby eliminating the bottle-neck between processor and memory which often arises in the prior art data processing systems.

FIG. 3 shows for descriptive purposes only, a memory 10 having two bubble layers 32 and two wave guides 34, constructed to permit the formation of bubbles in four locations on each bubble layer, as shown. In the particular illustration, when the laser beam passes through a bubble formed in the lower right hand quadrant of the first bubble layer 32, it passes through the same quadrant of the second bubble layer 32, to be detected by the first detector array as binary 1. The various bubbles intersected by the laser array directed through the layers may correspond to data stored by the external data processor. It will be appreciated that each time the beam passes through a magnetic bubble, and whether the emerging beam represents binary 1 or binary 0 depends on the number of bubbles which intercept the beam.

The beam incident on each of the magnetic bubble layers 32 is reflected and passes through the first and second wave guides 34 to the second detector array. Accordingly, the beam, reflected from the righthand lower quadrant of the first bubble layer 32 would represent a binary 1, and the beam reflected from the lower right hand quadrant of the second bubble layer would represent binary 0. Accordingly, the second detector array serves as a position sensor. Data may be detected by either one of the detector arrays, and logic functions may detected the others.

The particular representation of FIG. 3, shows a cross-conduction channel pattern. As explained above, the polarized light passing through the layers 32 of magnetic bubble domains is rotated by Faraday rotation. A small percentage of the beam is reflected to each of the wave guides 34 by Kerr effect for each magnetic bubble domain, but there is no reflection for other parts of the layer unoccupied by magnetic bubbles. The retrieval of the three-dimensional location of all the magnetic bubbles is used not only for the recovery of data stored in the memory, but also to perform logic functions. Any combination of 1's and 0's, or other values, may be used for logic processing.

The data processor 38 serves as a driver for the memory 10, and the data and logic information recovered by the detector arrays 30 and 30a may be passed to the logic circuitry in the processor to be reprogrammed.

The invention provides, therefore, a three-dimensional magneto-optic memory and logic processor combined which operates in a simplified and improved manner, and which acts to combine logic functions with the storage of data, so that data and logic functions can be processed instantly thereby eliminating the bottle-neck between processor and memory which occurs in the prior art processing system this bottle-neck is known as the Von Newman bottle-neck. Specifically, the distribution of information throughout the volume of the three-dimensional combined magneto-optic memory and logic processor of the invention obviates the conventional distinction between memory data elements and logic process elements, thereby avoiding the processor/memory communication problem known, as mentioned above, as the Von Newman Bottle-Neck.

As pointed out in U.S. Pat. No. 4,563,236 William E. Ross, et al., Assigned to Litton Systems, is well known in the prior art that a magnetic material will stabilize with a plurality of equally sized magnetic domains (bubbles). The concept of utilizing magnetic domains and polarized light to create a magneto-optic iron-garnet display has been described in an article by B. Hill and C. P. Schmidt entitled "Fast Switchable Magneto-Optic Memory-Display Components which appeared in the Philips Journal of research Vol. 33, Nos. 5–6, page 211.

U.S. Pat. No. 4,563,236 teaches a method for making large areas stable magnetic domains (bubbles) which may be switched from one direction of magnetization to another but which remains stable in either direction. Such large area magnetic domains find utility in the magneto-optic combined memory and logic processor of the invention. A method and apparatus for switching magnetic domains is described in U.S. Pat. No. 4,550,389 David L. Cox, et al., which also is assigned to Litton Systems, Inc.

While a particular embodiment of the invention has been shown and described, modifications may be made. It is intended in the claims to cover all such modifications which come within the true spirit and scope of the invention.

I claim:

1. A three-dimensional magneto-optic combined memory and logic processor comprising: an array of magnetic bubble layers positioned and spaced parallel relationship, which each layer being formed of light-transparent magnetic material capable of producing magnetic bubble domains; an electro-magnetic beam source positioned adjacent a first side of a said array of magnetic bubble layers for causing a polarized beam to pass through the array; a first photo-voltaic detector array positioned adjacent a second side of said array of magnetic bubble layers opposite to said first side; a second photo-voltaic detector array positioned adjacent to a third side of said array of magnetic bubble layers perpendicular to said first and second sides; data processor means connected to said array of magnetic bubble layers for controlling patterns of magnetic bubble domains on each of said layers and to cause said magnetic bubble domains to represent memory data and logic functions; and means included in said array of magnetic bubble layers for directing a percentage of said beam incident on each of said bubble memory layers to said second detector array; so that one of said first and second detector arrays produces binary coded electric signals representing memory data stored in said array of magnetic bubble layers and the other of said first and second of detector arrays simultaneously produces binary coded electric signals representing logic functions introduced into said array of magnetic bubble layers.

2. The three-dimensional magneto-optic combined memory and logic processor defined in claim 1, in which said directing means includes wave guide means positioned adjacent to each of said magnetic bubble layers and extending and extending parallel to said first and second sides of said array and towards said third side with a percentage of said beam being reflected into said wave guides means by Kerr effect for each magnetic bubble domain on each of said magnetic bubble layers.

3. The three-dimensional magneto-optic combined memory and logic processor defined in claim 1, in which said first and second detector arrays are connected to said data processor for supplying the binary coded electric signals produced thereby to said data processor.

4. The three-dimensional magneto-optic combined memory and logic processor defined in claim 1 in which each of said magnetic bubble layers consists of a selected ortho-ferrite garnet, amorphous material.

5. The three-dimensional magneto-optic combined memory and logic processor defined in claim 1, in which said electro-magnetic beam source comprises a laser beam source.

* * * * *